United States Patent [19]

Haraszti

[11] Patent Number: 5,612,964
[45] Date of Patent: Mar. 18, 1997

[54] HIGH PERFORMANCE, FAULT TOLERANT ORTHOGONAL SHUFFLE MEMORY AND METHOD

[76] Inventor: Tegze P. Haraszti, 102 Scholz Plz., No. 238, Newport Beach, Calif. 92663

[21] Appl. No.: 681,600

[22] Filed: Apr. 8, 1991

[51] Int. Cl.⁶ .......................... G11C 19/00; G11C 21/00; G11C 29/00
[52] U.S. Cl. ............................ 371/40.1; 365/75; 365/77; 365/78; 371/40.2
[58] Field of Search ................................. 371/40.1, 40.2, 371/37.4, 50.1, 51.1; 365/78, 73, 75, 77

[56] References Cited

U.S. PATENT DOCUMENTS

| | | | |
|---|---|---|---|
| 3,893,088 | 7/1975 | Bell | 365/78 |
| 3,953,838 | 4/1976 | Gilberg et al. | 365/78 |
| 3,963,908 | 6/1976 | Das | 371/51.1 |
| 4,024,509 | 5/1977 | Elmer | 365/78 X |
| 4,151,609 | 4/1979 | Moss | 365/78 X |
| 4,363,125 | 12/1982 | Brewer et al. | 371/40.1 X |
| 4,365,332 | 12/1982 | Rice | 371/501 X |
| 4,866,718 | 9/1989 | Fosdick | 371/40.1 |

OTHER PUBLICATIONS

Millman, J. et al., *Microelectronics*, McGraw–Hill, 1987, pp. 366–373, 315–325.
Rao, T. et al., *Error Control Coding for Computer Systems*, Prentice Hall, 1989, pp. 377–383.
"Novel Fault–Tolerant Circuits For Configurable Mass Memories", T.P. Haraszti et al, Proceedings of The IEEE Custom Integrated Circuits Conference, May 13–16, 1990, pp. 19.5.1–19.5.4.

*Primary Examiner*—Stephen M. Baker
*Attorney, Agent, or Firm*—Morland C. Fischer

[57] ABSTRACT

A high performance fault tolerant orthogonal shuffle memory comprising a plurality of memory cells arranged to form a two-dimensional array of rows and columns. Each memory cell includes a data store element for storing data and a multi-state data transmission element to provide access to the data stored in the data store element. Each memory cell has the dual function of storing and transmitting (i.e. shifting) data. The memory cell array is coupled to first and second registers and a shuffle signal generator. In operation, data is shuffled column by column through the array, such that only two columns of memory cells are activated at any time. The shuffle memory herein disclosed may form subarrays of each of a data storage array and a redundancy storage array that are coupled to an improved error detector and corrector to form a high performance fault tolerant orthogonal memory system.

12 Claims, 4 Drawing Sheets

HIGH PERFORMANCE, FAULT TOLERANT ORTHOGONAL SHUFFLE MEMORY AND METHOD

This invention was made with Government support under Contract No. F04701-86-C-0086 awarded by the Air Force. The Government has certain rights in this invention.

BACKGROUND OF THE INVENTION

1. Field of the Invention

This invention relates to semiconductor data storage devices and, more specifically, to a high performance fault tolerant orthogonal shuffle memory.

2. Statement of the Prior Art

As will be known to those skilled in the art, large capacity semiconductor data storage devices with sequential, parallel-sequential, random-sequential, and associative-sequential access modes have been implemented by means of random access memories (RAMs) coupled to an address sequencer device, or by means of a shift register (SR) type of device. Fault tolerancy for RAMs has been provided by implementation of bidirectional single parity check codes or Hamming codes, and by using redundant elements for replacements of faulty rows, columns or subarrays. Fault tolerancy for SRs and SR type of devices has been provided by the application of cyclic Hamming or some other digital cyclic codes or by duplications or by triplication of the device.

The conventional RAM approach, in configurations which involve implementations of sequential write, read or transfer of data, provide relatively low delta rates, high power dissipation, low reliability, low radiation hardness, low immunity against impacts of atomic particles, low tolerance for temperature variation, high noise sensitivity and high manufacturing costs in comparison to logic circuits fabricated with the same processing technology. The conventional RAM approach comprises arrays of memory cells, sense amplifiers, decoders, buffers, controllers and auxiliary address sequencers. In this configuration, the data rate for sequential write, read and transfer is limited by the access and cycle times of the RAM.

In RAM approaches, each datum is addressed separately through a critical time delay path which traditionally includes the additive delays produced by an address sequencer, a decoder, bus lines in the array of memory cells, sense amplifiers, buffers and an eventual error detector and corrector. Furthermore, the conventional RAM operation consumes a high amount of power, because at each access, all data lines and data terminals of the memory cells are precharged, while at least a cluster of sense amplifiers, the entire decoder, all input and output buffers, the controller, and the error detector and corrector are simultaneously activated. Moreover, the conventional RAMs are plagued with low reliability, little tolerance for the effects of accumulative ionizing radiation, temperature variations, and electromagnetic noises, because of the array-inherent small signal and data sensing operation.

In a RAM array, an address memory cell is loaded by a large impedance that includes the parasitic capacitance of the data line, the input capacitances of all unaddressed cells and the sense amplifier which is connected to the data line, as well as the resistances of said data line and the access device of the addressed cell. This large load impedance allows only very slow changes in read signal amplitudes which are accelerated and amplified by sense amplifiers. The sense amplifiers are of differential types in which any little imbalance may impair the operation. Imbalances in differential amplifiers are results of non-symmetrical change in transistor and interconnect parameters. These parameters may be degraded by the effect of semiconductor processing, nuclear irradiation, hot electron emission, temperature variations and others. The small signal type of operation allows for little operational margins which may disappear at small changes in transistor and interconnect parameters. Furthermore, data stored in traditional RAM cells may easily be altered by impacts of alpha or other atomic particles emitted from semiconductor packaging or present in cosmic environments. The manufacturing costs of traditional RAMs are high because of the tight parameter control and extra processing steps required for the circuits operating with small signals and for minimizing the sizes of memory cells.

The traditional SRs and SR-like devices dissipate excessive amount of power and are implemented in packing densities which are uncompetitive with RAMs for mass storage applications. The conventional SR approach comprises shift register stages, buffers and a controller. In this approach, the power dissipation is prohibitively high to implement large arrays, because at write, read and transfer operations, all register stages are simultaneously activated. Furthermore, SRs of dynamic types have to continuously rotate and amplify data content in order to avoid data losses. Moreover, the packing density of SRs is inherently low, because each of the register states comprises at least two data storage elements and two data transmission elements. This is in contrast to RAM cells which comprise only one data storage element and one or two data transmission elements.

The conventional error detectors and correctors, which have been implemented in cooperation with RAMs on a single semiconductor body, are capable of correcting only single bit errors and, in some designs, double bit errors, so as to considerably degrade the performance parameters of the RAMs. The most frequently implemented bidirectional single parity and imparity check code can correct only single bit errors. The speed and power performances of the RAM degrades considerably due to the circuit implementation of bidirectional single parity and imparity check codes and because traditional approaches use a large amount of two and three input logic gates in chain and parallel connections.

The rarely implemented double error correcting Hamming code needs a considerable amount of redundant bits for the increase of error correcting. SRs and SR type of storage devices use mostly cyclic Hamming codes for error detection and corrections thereby providing less degradation in speed and power than Hamming codes do in RAMs. Small SRs have occasionally been duplicated or triplicated to provide fault tolerance, but such redundancy results in decreased packing density and increased power consumption.

SUMMARY OF THE INVENTION

In general terms, the disadvantages of prior art random access memory, shift register and error detector and corrector approaches in sequential, parallel-sequential, random-sequential and associative-sequential data storage systems are overcome by the high performance orthogonal shuffle memory of the present invention cofunctioning with an improved error detector and corrector.

The orthogonal shuffle memory comprises an array formed of rows, columns or other pluralities of memory cells, a first register, a second register, and a shuffle signal generator. For all memory operations, including write, storage, read and transfer of data, the orthogonal shuffle memory requires only one data storage element and one data transmission element per bit. The data is shuffled column by column so that only two columns are activated at any time increment. The data appears sequentially on each input and output of the orthogonal shuffle memory.

The improved error detector and corrector comprises a data weigher, a check code register, a comparator, a corrector, and an optional data buffer. This improved error detector and corrector utilizes a multi-dimensional code, in which at least one of the code components is a digital weighted code, preferably a Berger type of code, while another code component is preferably a single parity and imparity check code. The preferred bidirectional combination of a Berger type of code and a single parity and imparity check code used in the present invention is able to correct all single, all burst and numerous other error patterns by comparing the check codes generated on write and read data.

A memory system may be formed comprising orthogonal shuffle memories and improved error detectors and correctors of the present invention so as to be capable of combining very large storage capacity with high data rate, low power dissipation, high reliability, high radiation hardness, high immunity against impacts of atomic particles, tolerance for temperature variations and for electro-magnetic noises as well as reduced manufacturing costs.

DESCRIPTION OF THE PREFERRED EMBODIMENT

Figure 1:
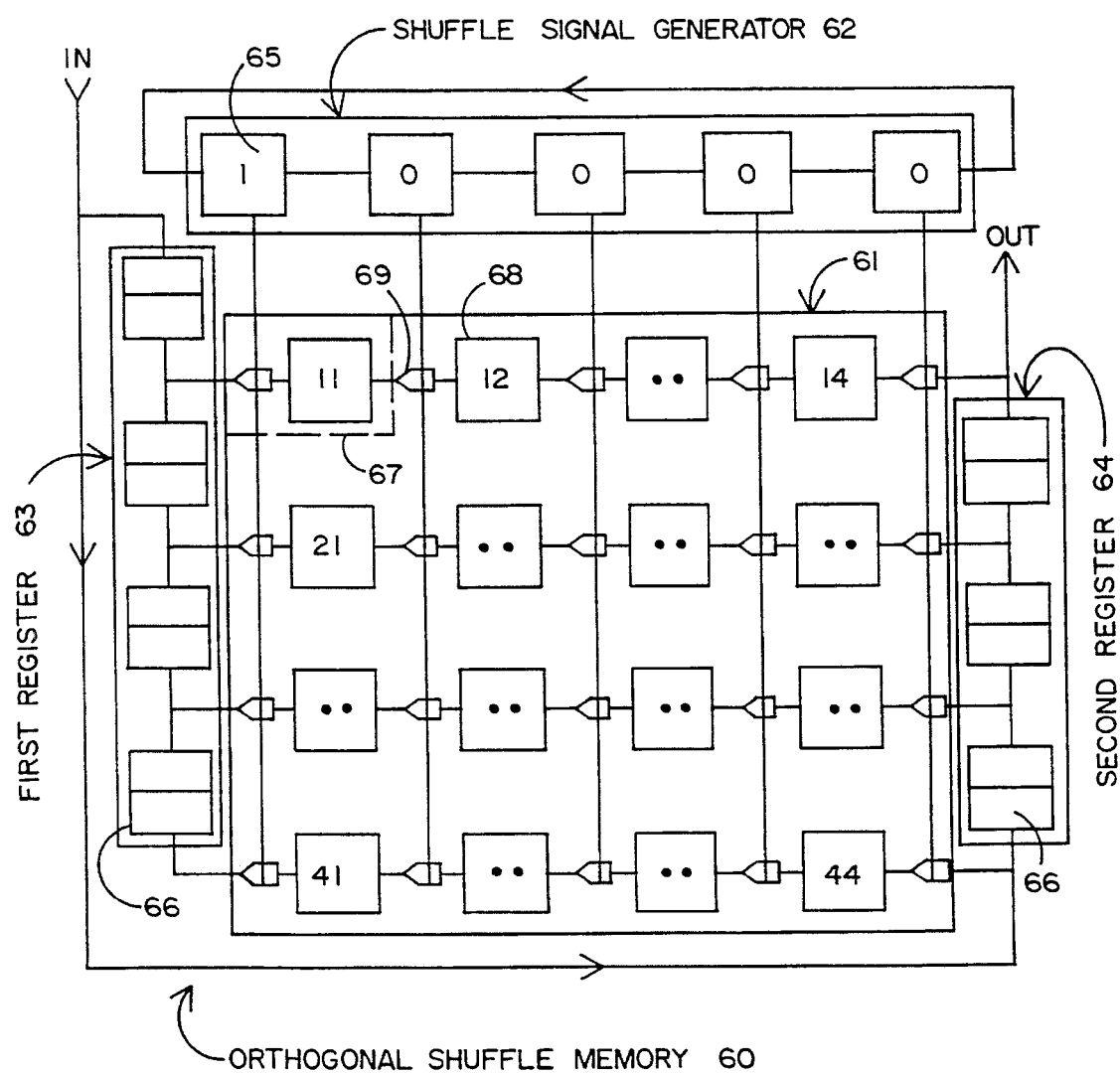
FIG. 1 shows the block diagram of an orthogonal shuffle memory formed in accordance with a first embodiment of the present invention.

FIG. 1 shows a block diagram of the preferred configuration of the orthogonal shuffle memory 60 which is presently disclosed. The orthogonal shuffle memory 60 is capable of writing and reading data in a sequential manner, as well as internally arranging and storing data for later use. One or a multiplicity of such orthogonal shuffle memories 60 may be constituent elements of data storage devices and memory systems. The orthogonal shuffle memory 60 comprises an array of storage elements 61, a shuffle signal generator 62, a first register 63 and a second register 64. The array 61 of storage elements includes a multiplicity of rows and columns of memory elements.

In the example of the invention, the rows of the array 61 are formed by electrically serially coupling a multiplicity of one bit storing memory cells 67, each comprising a data store element 68 and a data transmission element 69, so that a data store element 68 of a first memory cell 67 is coupled to a data transmission element 69 of the first memory cell 67, the data transmission element 69 of the first memory cell 67 is coupled to the data store element 68 of a second memory cell 67, the data store element 68 of the second memory cell is coupled to the data transmission element 69 of the second cell, and so forth. The columns of array 61 are formed by coupling the control nodes of the transmission elements 69 of a multiplicity of memory cells 67 by a common bus line. The first of such memory cell columns is coupled to the parallel inputs of the first register 63, the last of such memory cell columns is coupled to the parallel outputs of the second register 64, while all other columns are coupled to each other. Each of the columns of array 61 is connected to respective outputs of the shuffle signal generator 62.

The serial data output of the first register 63 is connected to the serial data input of the second register 64. In this example the serial input of the first register 63 and the serial output of the second register serve as the data input and output of the orthogonal shuffle memory 60. Nevertheless, any appropriate node of the array 61 of storage elements, first register 63 and second register 64 may be used as data input and output for the orthogonal shuffle memory 60.

The memory elements used in array 61 can be of any type, for instance the type used for storing a single bit of data or for storing a multiplicity of bits of data including subarrays, the types used for random access write-read, random access read-only, shift-register, as well as memory elements representing multiple valued logic or analog data. However, the present example for an orthogonal shuffle memory 60 uses identical memory cells 67 of the type that are capable of storing one bit.

As shown in FIG. 1, and as was previously disclosed, the single bit memory cell 67 is represented by two constituent components including a data store element 68 and a controlled data transmission element 69. The data store element 68 is suitable for holding a bit for a long period of time, while the data transmission element 69 is capable of being in a first state at which to electrically isolate the contents of the data store elements from each other and from other circuit elements and in a second state at which to allow data write, read and transfer operations. The states of a data transmission element 69 are controlled by a control terminal. A wide variety of such memory cells 67 are well known to those who are familiar with memory technology. By way of example, my earlier U.S. Pat. No. 4,779,226, describes a memory cell which can be used to fabricate orthogonal shuffle memory 60 for storage devices with storage capacities of 256 kbit, 10 Mbit and 40 Mbit.

The preferred embodiment of the shuffle signal generator 62, first register 63, and second register 64 include serially connected shift register stages. Nevertheless, a variety of circuit element or combinations of circuit elements such as counters, decoders, or other logic circuits can be used to generate the proper sequence for orthogonally shuffling data in the storage element array 61. The orthogonal shuffle memory 60 uses only half shift register stages 65 in the shuffle signal generator 62, while the first and second registers 63 and 64 include traditional full shift register stages 66. A single type of memory cell may be used as a common building element in all circuits of the orthogonal shuffle memory 60.

Figure 2A:
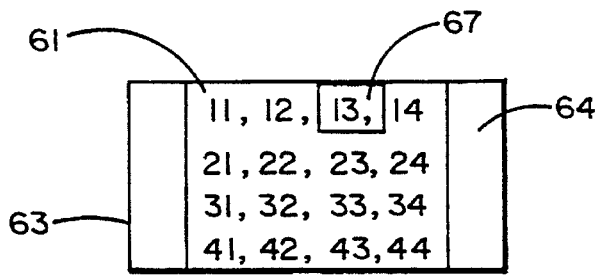
FIGS. 2a–2f show numerical tables illustrating the change of the information contents of the orthogonal shuffle memory of FIG. 1.

The operation of the orthogonal shuffle memory 60 shown in FIG. 1 is described while also referring to the tables shown in FIGS. 2a–2f. The numbers in the table 70 of FIG. 2a represent the data content of each memory cell 67 prior to the activation of the orthogonal shuffle memory 60. The changes of the data contents of the memory cells 67 in the array 61 as well as of the first and second registers 63 and 64 during the operation of the orthogonal shuffle memory 60 shown in FIG. 1 are illustrated by the successive changes of the numbers of the subsequent tables in FIGS. 2a–2f. The function of the shuffle signal generator 62 is synchronized with the functions of the first and second registers 63 and 64 so that each step in the shuffle signal generator 62 coincides with each full shift in the first and second registers 63 and 64.

Figure 2B:
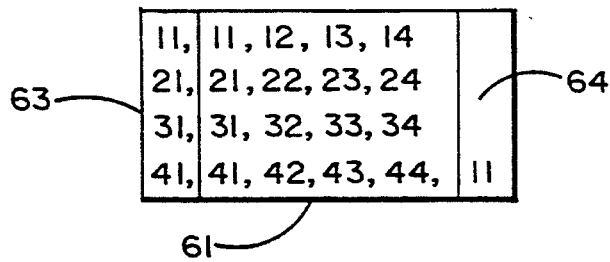

During a first step of a first set of steps of the shuffle memory operation, the shuffle signal generator 62 activates the data transmission elements 69 of the memory cells 67 located in the first column of the storage element array 61. As a result, and as represented in FIG. 2b, the data content of the data store elements 68 in the first column of the array 61 is transferred into the first register 63. Simultaneously, a first bit of the first register 63 is transferred into the second register 64, while the data contents of all other stages in the first and second registers 63 and 64 are shifted to their next successive stages.

Figure 2C:
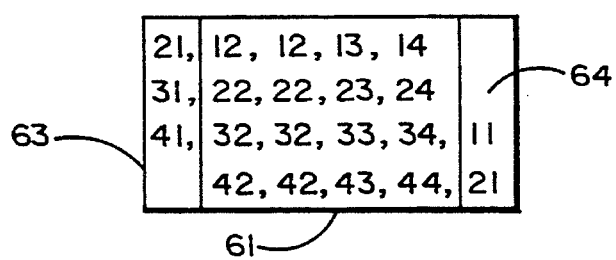

During a second step of the shuffle memory operation, and as shown in FIG. 2c, the shuffle signal generator 62 activates the data transmission elements 69 of the memory cells 67 located in a second column of the storage element array 61. As a result, the data content of the second column of data store elements 68 of the array 61 is transferred into the data store elements 68 of the first column of the array 61. Simultaneously, the second bit of the first register 63 is transferred into the second register 64, while the contents of all other stages of the first and second registers 63 and 64 are shifted into their next successive stages.

Figure 2D:
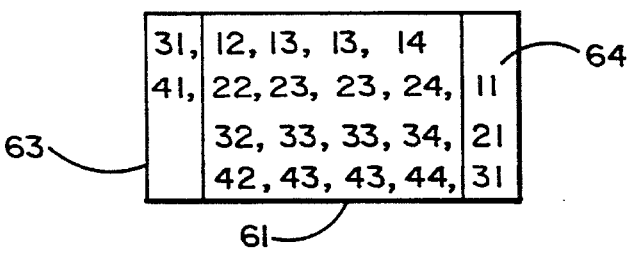
Figure 2E:
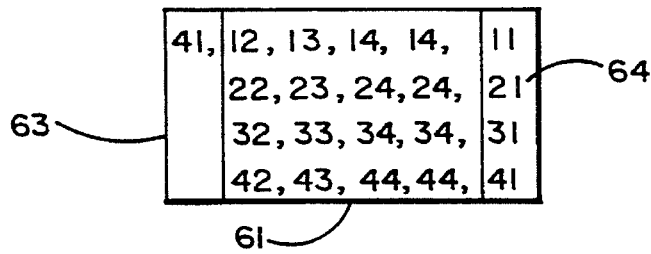

During consecutive steps of the shuffle memory operation shown in FIGS. 2d and 2e, the data content of the column that spatially succeeds the column that was activated at the previous step is transferred into the previously activated column in the array 61 of memory cells 67. Simultaneously, the content of a first stage of the first register 63 is shifted into the second register 64, while the contents of all stages of the first and second registers 63 and 64 are shifted into their next successive stages.

Figure 2F:
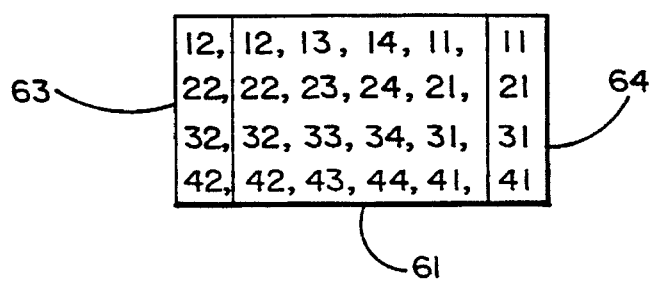

During a last step of the first set of steps, and as shown in FIG. 2f, the entire data content of the second register 64 is transferred into the memory cells 67 of the last column, and the data content of each column is transferred into its next successive column. In the exemplary four-by-four storage element array shown in FIGS. 1 and 2, the corresponding shuffle memory operation consists of four steps, while in an n-by-n configuration, the operation consists of n steps. Repeating these four steps four times in the exemplary four-by-four configuration, or repeating the n steps n times in an n-by-n configuration, the original data structure (of FIG. 2a) is reinstated in the storage array 61.

The description of the configuration and operation of the orthogonal shuffle memory 60 shows that only one memory cell 67, comprising one data store component 68 and one data transmission element 69, is used to transfer data. Furthermore, it is apparent that each of the memory cells 67 is loaded only by the very small input impedance of one of the memory cells 67 in the array 61. It is also shown that only two columns of memory cells 67 are activated at a time in the array 61 in addition to the operation of the shuffle signal generator 62 and the first and second registers 63 and 64. Moreover, and by virtue of the present invention, neither sense amplifies, nor any small signal circuits, precharge circuits, or address decoder is required in the presently disclosed orthogonal shuffle memory 60. These technical features result in the following advantages.

High packing density is provided by the use of a single memory cell per bit for storage, access and transfer of data to both static and dynamic random access memories. This is in contrast to shift register types of devices which use two memory cells per bit in each stage for transferring data without any loss of information. High speed write and read data rates are a result of the minimum capacitive and resistive load coupled to the individual memory cells. This is in contrast to the lower speed write and read data rates of the well known RAMs, in which the memory cells are loaded by the large capacitance and considerable resistance of the data bus lines. Very low power is dissipated during the operation of the orthogonal shuffle memory, because only two columns of the array are activated at any time. This is in contrast with both random access memories and shift register type of devices. Specifically, random access memory devices typically use considerable power to precharge all data lines in all columns in the array of memory cells and activate the decoders and read and write circuits at each access, while shift register types of devices activate all memory cells in their entire array. Improved reliability, radiation hardness, immunity against the impact of atomic particles, noise margins, and tolerance of temperature variations, are results of the absence of sense amplifiers, small signal and precharge circuits. This is in contrast to random access memories which typically have to use sense amplifiers as well as small signal and precharge circuits for proper operation. Decreased manufacturing costs are the results of the suitability of the shuffle memory to semiconductor processing techniques involving a decreased number of steps and by the increased allowance for parameter variations. This is in contrast to the processing used in manufacturing of random access memories which typically require a high number of processing steps and have very small allowance for parameter variations.

Figure 3:
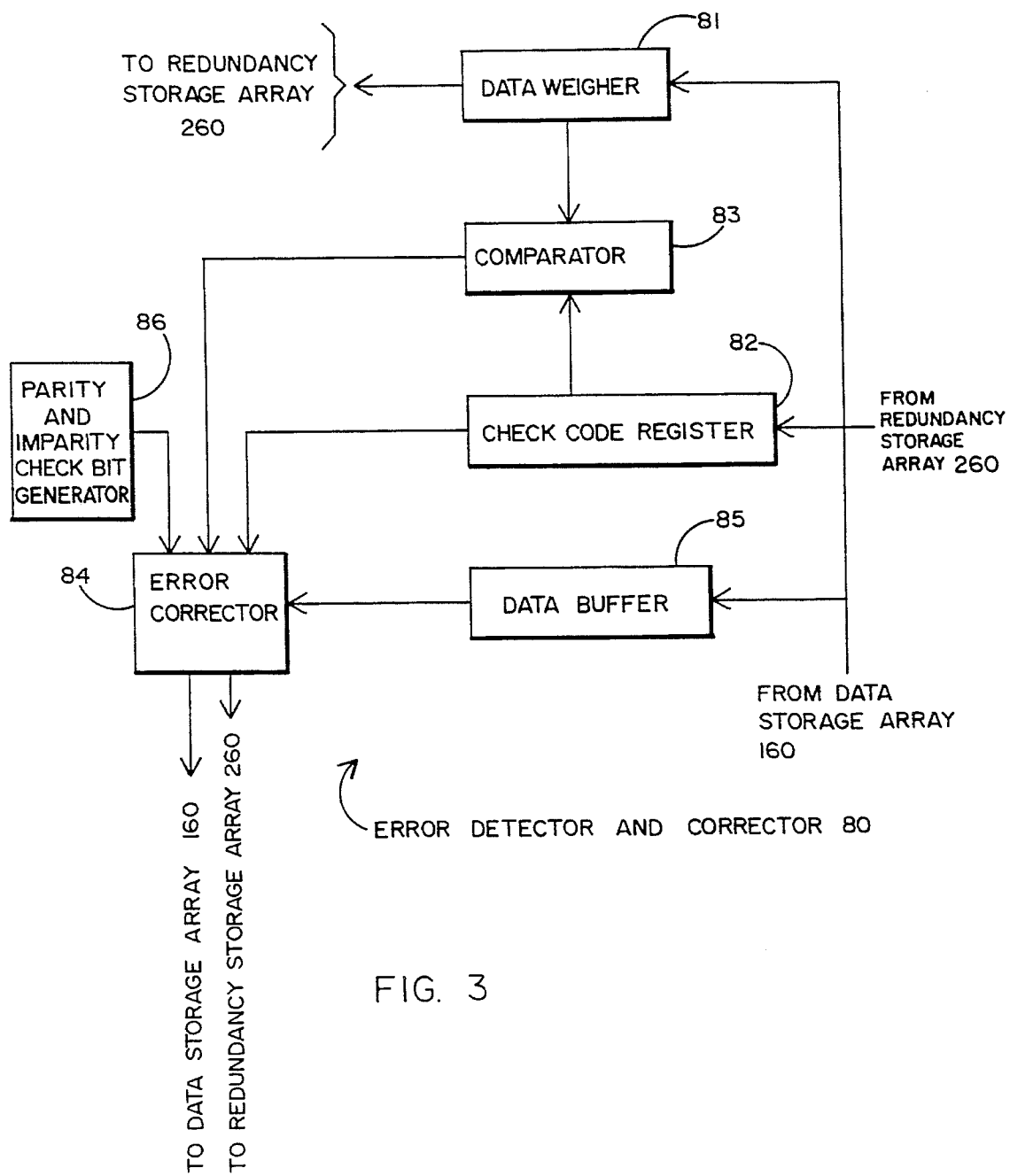
FIG. 3 shows the block diagram of an improved error detector and corrector formed in accordance with a second embodiment of the present invention.

FIG. 3 of the drawings shows a block diagram for an improved error detector and corrector 80 which is preferably used in cooperation with the previously described orthogonal shuffle memory 60 of FIG. 1. This improved error detector and corrector 80 is capable of detecting and correcting single bit errors, burst errors and a variety of other errors patterns, which errors may result from the effects of impacts of atomic particle, nuclear irradiation, electrical noises, hot electron emission, electromigration, temperature variations, general wear and tear, etc. The improved error detector and corrector 80 may also be employed by types of storage devices other than shuffle memory 60, such as random access memories, read only memories, shift registers, first-in first-out registers, and the like.

The preferred embodiment of the improved error detector and corrector 80 comprises a data weigher 81, a check code register 82, a digital comparator 83, an error corrector 84 and a data buffer 85. The data weigher 81 is coupled to the check code register 82, to a data storage array (designated 160 in FIG. 5) and to a first input port of the comparator 83. The check code register 82 is coupled to the data weigher 81, to a second input port of the comparator 83 and to a redundancy storage array (designated 260 in FIG. 5). The comparator 83 is also coupled to a first input port of the error corrector 84. The error corrector 84 is coupled, at respective input ports thereof, to the check code register 82, to the comparator 83, to the data buffer 85, and to a parity and imparity check bit generator 86 and, at respective output ports thereof, to the data array 87 and to the redundancy array 260.

In the preferred embodiment of the error detector and corrector 80, each of the data weigher 81, the check code register 82, and the comparator 83 comprises an identical number of stages or bits, which number is determined by the number of bits in the check code. It is also preferred that the data weigher 81 computes the Hamming weight of data words by a counter (not shown), specifically by a non-linear counter which is well known to those skilled in the art of digital circuits. Traditionally, a non-linear counter comprises a linear shift-register and a logic gate which provides a feedback from the output of the shift register to the inputs of selected stages of the shift register. The advantages of the application of such non-linear counter in the improved error detector and corrector 80 are its design compatibility with the check code register 82 and a relatively glitch free operation.

Figure 4:
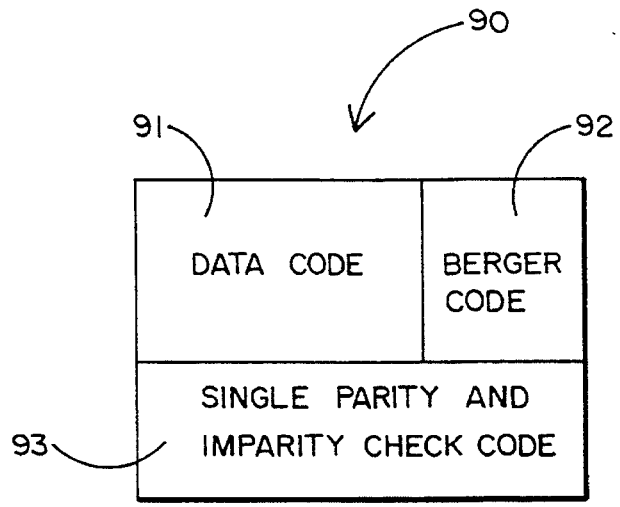
FIG. 4 represents the format of a bidirectional code word used by the improved error detector and corrector of FIG. 3.

The operation of the improved error detector and corrector 80 shown in FIG. 3 is described with reference to an exemplary bidirectional code word 90, such as that shown in FIG. 4. The exemplary bidirectional code word 90 comprises a field of data codes 91, a field of Berger type check codes 92, and a field of single parity and imparity bit check codes 93. The code word 90 is dispersed in time and space, so that the data rows of the code word 90 are transmitted serially while the columns of the code word 90 are transmitted parallel during write and read operations. For each data row, there is a corresponding channel of data, and each channel of data is supplied to an error detector and corrector 80 of FIG. 3.

Figure 5:
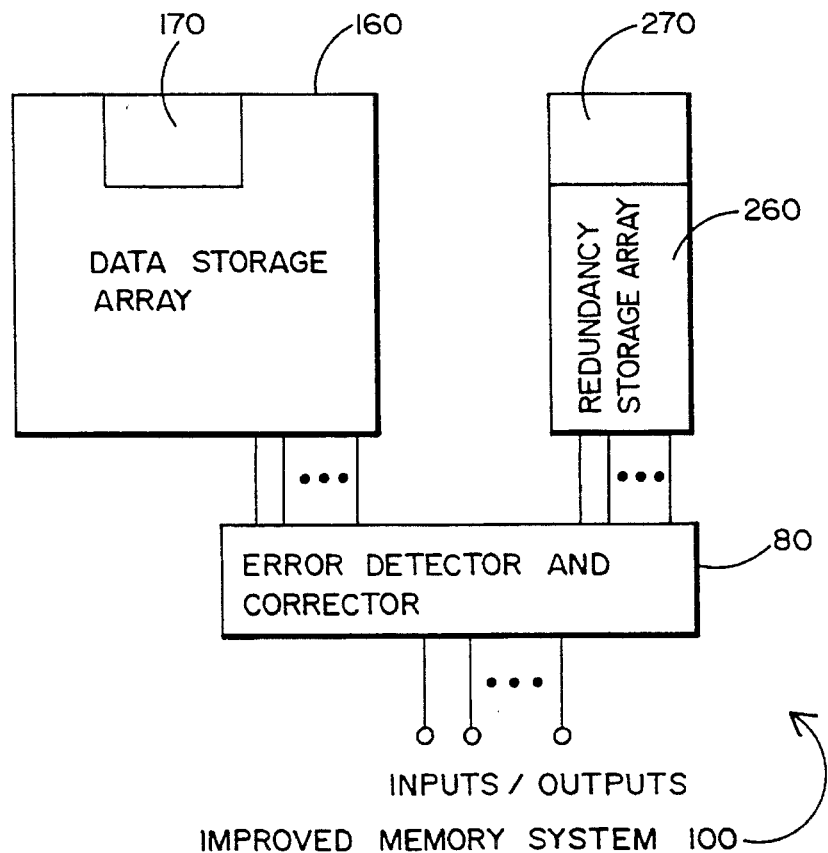
FIG. 5 shows the block diagram of an improved memory system formed in accordance with a third embodiment of the present invention and incorporating the shuffle memory of FIG. 1 and the error detector and corrector of FIG. 3.

During write operation, each row of the data is transmitted into a data weigher 81 and, simultaneously, into a data storage array 160 (of FIG. 5). Each data weigher 81 converts the data into a Berger type of code by computing the Hamming weight of the serially transmitted data row. In the preferred embodiment, and as previously disclosed, a non-linear counter serves as the data weigher 81 by counting the number of logic 1 or logic 0 bits in each row of the data word. The resulting Berger type of code is transferred into a redundant storage array 260 (of FIG. 5).

During read operation, the data is transmitted through each channel of data into the data weigher 81 of the error detector and corrector 80 from the data storage array, and, simultaneously, the Berger type of code generated previously at write from the corresponding data word is transferred into the check code register 82 from the redundant storage array. In each error detector and corrector 80, the data weigher 81 generates a Berger type of code of the read data. The comparator 83 compares the resulting Berger type of code residing in the data weigher 81 with the Berger type of code of the check code register 82 which is generated on the same data word during write. In case of a discrepancy between the contents of the data weigher 81 and check code register 82, a flag signal appears on the output of the comparator 83 to indicate an error in the particular row of data or check code, which determines one of the coordinates of the error locations. Flag signals detecting imparity and parity generated on the parallel transmitted components of the data word determine the other coordinates of the error locations. The simultaneous appearance of both flag signals generated from Berger type of codes and from single parity and imparity bit check codes in the error corrector 84 results in a determination of the precise location of the faulty bits in the read data and check codes and in flipping the faulty bits from logic 0 to logic 1 and vice versa, thereby correcting the errors.

In order to provide appropriate timing for the correction, the read data and check codes are delayed by the data buffer 85, because the generation of the check codes is completed only after the transmission of the entire data word. The configuration, operation, and implementation of single parity and imparity bit check codes as well as of the counters, registers, comparators, data buffers and logic gates applied in this invention are well known to those skilled in the art. The time delay provided by the data buffer 85 in this example may inherently be generated by constituent elements of the shuffle memory 60. Therefore, the data buffer 85 is optional and may be eliminated from the configuration of the improved error detector and corrector 80.

The error detector and corrector 80 of FIG. 3 is capable of correcting all single bit errors, all burst errors in any one of the data and check bit channels, and numerous other error patterns appearing in a multiplicity of the data and check bit channels. This is in contrast to conventional error detectors used in random access and read only memories implemented in a single silicon substrate, which are usually capable of detecting and correcting only single bit, and occasionally, double bit errors.

The number of bits in the check code is very small for long data words, because of the exponential relationship between number data bits k and check code bits r; $2^r=k$. The small number of bits along with the small number and size of the elements constituting the improved error detector and corrector 80 make possible economical implementations, so that the substrate area occupied by error control circuits are only a negligible fraction of the substrate area occupied by the data storage array. Furthermore, the small number and size of the constituent elements result in implementations which provide very high speed operation and low power dissipation. Therefore, the influence of the error detector and corrector 80 on the operating speed and power dissipation of the storage devices in insignificant. In the past, the implementation of error control circuits, which detect and correct burst errors and other error patterns containing more than two erroneous bits, have resulted in substantial area requirements on the substrate, significantly reduced operational speed and increased power dissipation.

FIG. 5 of the drawings shows the block diagram of a high performance fault tolerant orthogonal memory system 100 which utilizes orthogonal shuffle memories (60 of FIG. 1) and the improved error detector and correction (80 of FIG. 3). Memory system 100 is a fault-tolerant write-read memory system preferably made by a complementary metal oxide semiconductor (CMOS) process. In the present example, the improved memory system 100, which combines high performance with high reliability, is formed by an array 160 of orthogonal shuffle memories 60, a redundant array of 260 of orthogonal shuffle memories, and the error detector and corrector 80 of FIG. 3 using a weighted type of code. Both the data array 160 and the redundancy array 260 includes subarrays of orthogonal shuffle circuits 170 and 270, although the arrays 160 and 260 could also be formed from other storage devices. In the configuration shown in FIG. 5, the bit storage capacity of the redundancy array 260 is significantly smaller than that of the data array 160, and the ratio of these bit storage capacities are optimized for the type of constituent circuit elements and processing used for implementation of the memory system 100.

The high performance fault tolerant orthogonal shuffle memory system 100, like other memory systems, may comprise a large variety of other constituent elements, such as control, clock generator, address sequencer, decoder, built-in repair and test circuit, etc. Both the data array 160 of orthogonal shuffle memories and the redundant array 260 of orthogonal shuffle memories are coupled to the improved error detecting and correcting circuit 80. These couplings provide write and read access paths to both data and redundant arrays 160 and 260 through the error detector and corrector 180, and the number of these couplings is arbitrary. The improved error detector and corrector 80 is provided with an arbitrary number of data inputs and outputs for writing and reading data to and from the memory system 100, which inputs and outputs are coupled to both the data and the redundant arrays 160 and 260.

The memory system 100 operates in sequential access mode when only one of the inputs and outputs is used, in parallel-sequential access mode when more than one input and output are used to simultaneously access a multiplicity of subarrays 170 and 270, in random-sequential access mode when more than one input and output are used and a decoder randomly addresses the subarrays 170 and 270, and in associative-sequential access mode when the subarrays 170 and 270 are accessed by their data contents.

The operation of the presently disclosed memory system 100 is described as follows. For the present example, data is represented by two-dimensional words comprising bits which are dispersed in space and time suitable for parallel-sequential access. At write operation, the error detector and corrector 80 encodes the incoming data into check bits and writes these check bits into the redundant array 260 of orthogonal shuffle memories. Simultaneously, the incoming data is written into the storage cells of the data array 160 of orthogonal shuffle memories. In this preferred operation mode, the error detector and corrector 80 generates single parity check codes on the parallel received components of the data word and Berger type of codes on the sequentially received components of the words. In both the data and redundant arrays 160 and 260, one or more subarrays of orthogonal shuffle memories 170 and 270 takes over the data and check bits, respectively, perform write or rewrite operation, and form data structure which is inherent to the operation of subarrays 170 and 270. The storage elements of the subarrays of orthogonal shuffle memories are capable of storing the data and the redundant check bits for an extended period of time. The length of this time period is determined by the type of the memory cell.

At read operation, the improved error detector and corrector 80 receives the data and the check bits from the data and redundant arrays 160 and 260 of orthogonal shuffle memories and generates single parity and Berger type of check codes on the parallel and sequential components of the data word, respectively. The error detector and corrector 80 compares the read check bits with the previously written check bits, detects the errors, determines the location of the errors, and corrects the data before the data leaves the memory system 100. Simultaneously, the corrected data and check codes are rewritten into subarrays 170 and 270. The application of redundant elements for substitution of defective elements is an effective method of improving yield and reliability in spite of the possibilities for fault transfer between the data and redundant storages by the common supply, data and select bus lines. Therefore, such a repair system a described above may be used beneficially in the present invention as an addition to the improved error detector and corrector 80.

While this invention has been described with reference to the illustrated embodiments, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modifications or embodiments as fall within the true scope of the invention.

For example, the memory cells (e.g. 67) which form the memory cell array 61 of shuffle memory 60 may be formed from any suitable semiconductor material according to known processing techniques. In addition, it is within the scope of this invention to connect the memory cells (e.g. 66) of the first register 63 of memory 60 directly to respective ones of the memory cells which form the last column of array 61, thereby bypassing the second register 64.

Having thus set forth the preferred embodiment, what is claimed is:

1. A method for sequentially accessing, storing, reading and writing data in a memory comprising first and second multi-stage registers holding one data bit per stage and a memory cell array coupled to said first and second registers and having rows and columns of memory cells, each memory cell from said memory cell array including a data storage element and a data transmission element coupled to said data storage element, said method comprising the steps of:

(a) transferring the data contents of the data storage elements of the first column of memory cells of said array into the first register during a first time interval by way of respective ones of said data transmission elements of said first column of memory cells;

(b) transferring the data contents of the data storage elements of the second column of memory cells of said array into the data storage elements of the memory cells of said first column during a second time interval by way of respective ones of said data transmission elements of said second column of memory cells;

(c) transferring the data contents of the data storage elements of each succeeding column of memory cells of said array into the data storage elements of the memory cells of the immediately-preceding column during another time interval by way of respective ones of said data transmission elements of said succeeding column of memory cells;

(d) repeating step (c) until the data contents of the data storage elements of the last column of memory cells of said array are transferred into the data storage elements of the memory cells in the next-to-last column by way of respective ones of said data storage elements of said last column of memory cells, such that data is transferred between the storage elements of the memory cells of only two columns of said array during any time interval;

(e) transferring the data contents of said second register into the data storage elements of the last column of memory cells of said array;

(f) shifting the data contents of said first and second registers by one bit during each of said steps (a) through (e); and (g) supplying the data contents of the first stage of said first register into the first stage of said second register during each of said steps (a) through (e).

2. The method recited in claim 1, including the additional step of cyclically repeating steps (a) through (e) and reading or writing data from or to said first and second registers during any of said steps.

3. The method recited in claim 1, including the additional steps of:

connecting each of the data storage elements of the memory cells in a row of said memory cell array in electrical series;

connecting each of the data storage elements of the memory cells in a column of said memory cell array in electrical parallel; and interconnecting each of the data transmission elements of the memory cells in a column of said memory cell array by a common bus line to allow the simultaneous transfer of data in and out of the memory cells of each column.

4. The method recited in claim 1, including the additional steps of forming each of said first and second registers from a plurality of shift register stages for receiving, storing and transferring data; and connecting each stage of said first and second registers to a respective column of memory cells of said memory cell array.

5. The method recited in claim 1, including the additional step of fabricating each of said memory cells of said memory cell array from semiconductor material.

6. The method recited in claim 1, including the additional step of coupling a multi-stage signal generator holding one data bit per stage to said memory cell array such that each stage of said signal generator is connected to each of the data transmission elements of a respective column of memory cells.

7. The method recited in claim 6, including the additional step of connecting the last stage of said signal generator to the first stage thereof.

8. The method recited in claim 1, including the additional step of connecting an error detector and corrector to said memory for improving the fault tolerancy thereof, said error detector and corrector comprising:

a data weigher coupled to said memory to receive data words therefrom and to generate check codes by computing weights for said data words;

redundancy storage means connected to said data weigher for receiving and storing the check codes generated by said data weigher;

a check code register connected to said redundancy storage means for receiving and temporarily storing the check codes from said redundancy storage means;

a comparator connected to said data weigher and to said check code register to receive the check codes therefrom, said comparator comparing the check code generated by said data weigher for a particular data word during a write operation of said memory to the check code generated by said data weigher for said data word during a read operation, said comparator generating an error flag output signal when a discrepancy occurs between the check codes compared thereby;

error corrector means connected to said check code register to receive the check codes stored therein and to said comparator to receive said error flag signal therefrom, said error corrector means locating and correcting the error occurring in the particular data word of said memory and in the particular check code so as to supply corrected data to said memory and corrected check codes to said redundancy storage means; and means to couple said memory to said error corrector means to supply data words from said memory to said error corrector means.

9. The method recited in claim 8, including the additional step of coupling said memory to said error corrector means by means of a data buffer.

10. The method recited in claim 8, including the additional step of using a counter to form the data weigher of said error detector and corrector.

11. The method recited in claim 8, including the additional step of selecting a Berger-type code as the information weighted code used by the data weigher of said error detector and corrector.

12. The method recited in claim 8, including the additional step of fabricating said error detector and corrector from semiconductor material.

* * * * *